United States Patent [19]

Lehureau

[11] Patent Number: 5,337,172
[45] Date of Patent: Aug. 9, 1994

[54] LIQUID CRYSTAL MATRIX CONTROL EMPLOYING DOPED SEMICONDUCTOR PIXEL ELECTRODE SURROUNDED BY UNDOPED CHANNEL REGION

[75] Inventor: Jean-Claude Lehureau, Sainte Genevievedes Bois, France

[73] Assignee: Thomson-CSF, Puteaux, France

[21] Appl. No.: 855,856

[22] Filed: Mar. 20, 1992

[30] Foreign Application Priority Data

Mar. 26, 1991 [FR] France .................. 91 03625

[51] Int. Cl.$^5$ ................................. G02F 1/1343
[52] U.S. Cl. ............................ 359/59; 359/57; 359/87; 257/59; 257/72
[58] Field of Search ............ 359/54, 55, 56, 57, 359/59, 87; 257/59, 72

[56] References Cited

U.S. PATENT DOCUMENTS

| | | | |
|---|---|---|---|
| 4,204,217 | 5/1980 | Goodman et al. | 359/59 |
| 4,409,724 | 10/1983 | Tasch, Jr. et al. | 257/72 |
| 4,537,471 | 8/1985 | Grinberg et al. | 359/59 |
| 4,799,094 | 1/1989 | Rougeot | 257/59 |
| 4,824,213 | 4/1989 | Morokawa | 359/67 |
| 4,876,668 | 10/1989 | Thakoor et al. | 259/72 |
| 4,881,797 | 11/1989 | Aoki et al. | 359/67 |
| 5,128,786 | 7/1992 | Yanagisawa | 359/67 |
| 5,191,453 | 3/1993 | Okumura | 359/59 |
| 5,245,452 | 9/1993 | Nakamura et al. | 359/59 |

FOREIGN PATENT DOCUMENTS 0348209 12/1989 European Pat. Off. .

*Primary Examiner*—William L. Sikes
*Assistant Examiner*—Kenneth Parker
*Attorney, Agent, or Firm*—Oblon, Spivak, MccClelland, Maier & Neustadt

[57] ABSTRACT

A matrix display device using electro-optical material, wherein the material is inserted between two substrates, each comprising an array of electrodes. One of these arrays comprises transparent doped semiconductor zones acting as pixel electrodes surrounded by zones with little or no doping, constituting the channel of a control transistor, the electrode of which forms the source or the drain. The gate electrode may be formed as a ladder shaped structure over the channel in which the areas between the rungs are pixel electrodes.

10 Claims, 2 Drawing Sheets

LIQUID CRYSTAL MATRIX CONTROL EMPLOYING DOPED SEMICONDUCTOR PIXEL ELECTRODE SURROUNDED BY UNDOPED CHANNEL REGION

BACKGROUND OF THE INVENTION

1. Field of the Invention

The present invention relates to display screens comprising a layer of electro-optical material, for example a layer of liquid crystal.

2. Description of the Prior Art

As is known, these screens generally comprise a large number of square or rectangular pixels. The definition of the screen depends on the number of pixels capable of receiving an information element. Each pixel is controlled by the application of an electrical field. For the display of video information elements, matrix type displays have been proposed. Each pixel is then defined by the intersection of two arrays of orthogonal conductors called lines and columns. It then becomes possible to reduce the number of connections of M elements from a value M to twice the square root of M. By contrast, the matrix structure raises serious problems as regards the control of the screen and of the electro-optical material having the task of converting the electrical signal into a visual signal. Indeed, in this type of addressing, it is possible to simultaneously address only the pixels of one and the same line i in applying, to this line, an exciting voltage Vi and in applying, to the columns, voltages Vj that depend on the state which is to be assumed by the pixels (i,j). Each line of the screen is excited sequentially during a period $t = T/N$ where T is the screen addressing time and N is the number of lines. If the electro-optical material does not have any memory of its own, the information has to be maintained by the periodic re-excitation of the activated pixels. The maximum value of this regeneration period T is fixed physiologically at about 40 ms. Hence, the time T devoted to the excitation of a pixel is $t = 40/N$ ms and becomes very short when N increases.

One of the approaches envisaged to overcome this problem is to use screens with active control for which the electro-optical material is placed in series with an electronic switch (such as a diode or a transistor). The picture memory may thus be constituted by two arrays of line and column conductors, at the intersection of which there is, for example, a switching transistor connected to the capacitor formed by the electro-optical material and its control electrodes (FIG. 1). In this case, the gate of the transistor is connected to the line electrode and its source to the column electrode, through which there flows the video frequency signal. When a line i is excited, a voltage is applied so as to make all the transistors of the line conductive. The capacitors of the electro-optical cells get charged at the video voltages applied to the columns. When the line i stops being excited, the transistors are off, and the information elements are kept in the capacitors of the previously addressed line.

The improvement of the performance characteristics of a TFT (thin film transistor) screen, as compared with a screen with direct addressing, is obtained however at the cost of increased technological complexity due to the number of vacuum depositions and of masking steps needed for the making of the transistors of the screen, as well as to faults such as cut lines, line-column short-circuits or defective pixels. The short-circuits between lines and columns arise chiefly out of the fact that the lines and columns are formed on one and the same glass plate.

SUMMARY OF THE INVENTION

To overcome these technological problems, the present invention proposes a new structure of a matrix display device using electro-optical material, combining the advantages of the mounting of the columns on the wall opposite that of the lines, the use of transistors and their making on a single masking level, the known methods for the making of transistor-based control devices using at least two masking levels.

The device according to the invention is a matrix display device using electro-optical material, said matrix display device comprising a matrix array of elementary picture zones constituted by an electro-optical material placed between two electrodes. One of these two electrodes is constituted by a transparent doped semiconductor zone completely surrounded by a semiconductor zone with little or no doping, constituting the channel of a control transistor, the electrode of which forms the source or the drain. The display device further includes means for the addressing of the electrodes, enabling the selective application, to each zone, of an electrical field adapted to the desired picture.

In a display device according to the invention, the addressing of the lines and the addressing of the columns are done on either side of the electro-optical material. The information elements are introduced preferably in columns of transparent electrodes deposited on a glass substrate. To transmit these information elements to the pixels of a given line, it is necessary to actuate the doped semiconductor electrodes defining the line electrodes. To this end, the zones with little or no doping may be covered with a metal gate which, when it is energized, can be used to make the channel of the transistor conductive and, thereby, provide for the conduction between the source and the drain, hence between two pixel electrodes. The gate structure associated with the zones having little or no doping may be represented by a ladder, the uprights of which form an addressing line and the rungs of which enable the separation of the adjacent pixels of one and the same line. The pixels of another line are defined by another ladder which is not electrically connected to the first one.

When the ladder is energized, the electrodes of the line associated with the column electrodes enable the pixels of the line considered to be charged. When the line is no longer addressed, the charges remain blocked in the pixel semiconductor electrodes and the information elements remain thus recorded until a new addressing of the line, hence until the introduction of new information elements. However, the memory of the pixels is related to leakage currents which ought to be negligible at the channel of the transistor.

Other alternative embodiments of a display device according to the invention may be represented by quincunxial or honeycombed gate structures (associated with zones having little or no doping ), it being unnecessary for the pixels to be linear or orthogonal.

In principle, the zones with little or no doping that form the channel of the access transistors are deposited on a glass substrate and covered with a gate insulator layer, itself covered with a conductive gate (direct MOS structure). However, the transistors may also be thin film transistors of the type with reverse multistage structure. In this structure, the gate is deposited on a substrate and buried beneath gate insulating and semiconductive layers.

The semiconductor used, which may be locally doped, is preferably made of amorphous silicon doped by a phosphorus presensitization of the substrate or by standard implantation. It may also be polycrystalline silicon or an organic semiconductor such as tetrathiofulvalene (TTF) or tetracyanoquinodimethane (TCNQ). It should enable the making of transparent pixel electrodes to enable light to go through the display device.

Another object of the invention is a method for the manufacture of a display device according to the invention, comprising the formation of two arrays of electrodes for the application of an electrical field to separate substrates and the positioning of an electro-optical material between the two substrates, the formation of one of the arrays comprising the making of individual access transistors to control each pixel.

This method comprises notably the following steps:
in any order, on the one hand, the forming of a semiconductor layer with little or no doping which will locally constitute the channel of transistors and, on the other hand, the depositing and etching of the control gates of these transistors, each of these gates being constituted in ladder form with uprights in lines and transversal rungs connecting the uprights, the space between two consecutive rungs defining a pixel separated from a neighboring pixel by one of the two rungs;
doping the non-doped semiconductor layer parts, in using the conduction control gates as a mask.

BRIEF DESCRIPTION OF THE DRAWINGS

The present invention shall be understood more clearly and other advantages shall appear from the following description and from the appended figures, of which.

MORE DETAILED DESCRIPTION

Figure 1:
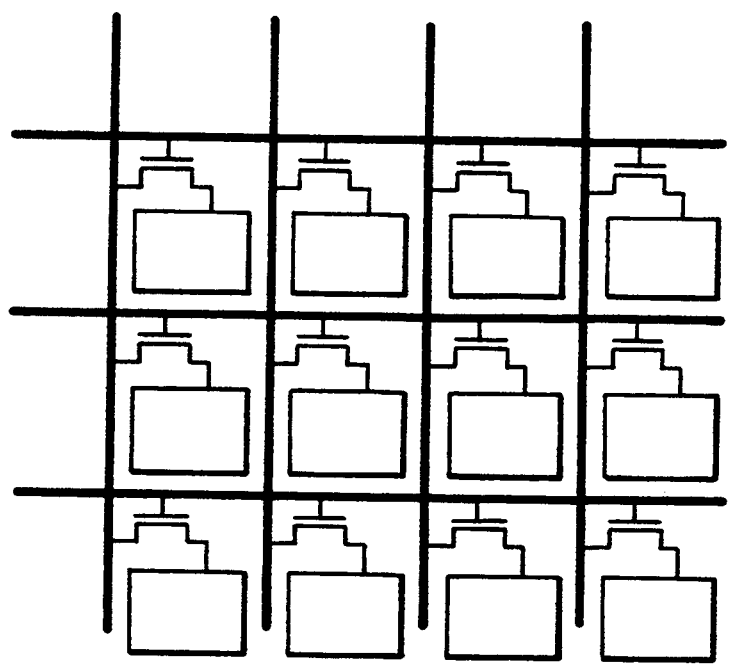
FIG. 1 shows a liquid crystal matrix display device according to the prior art, using transistors.
Figure 2:
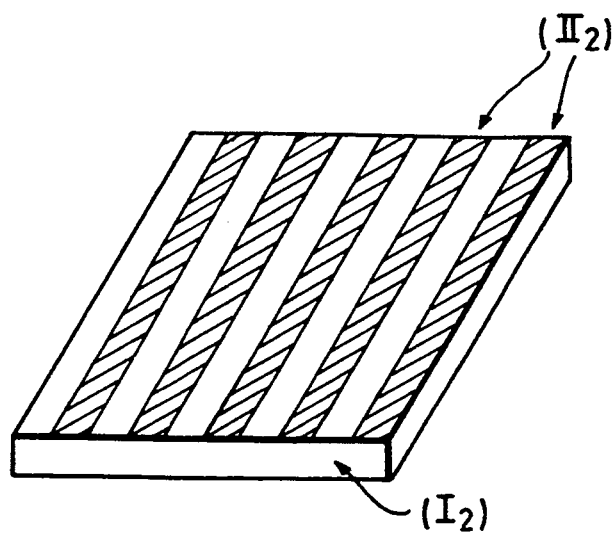
FIG. 2 shows the substrate ($I_2$) supporting the columns of electrodes of a display device according to the invention.
Figure 3:
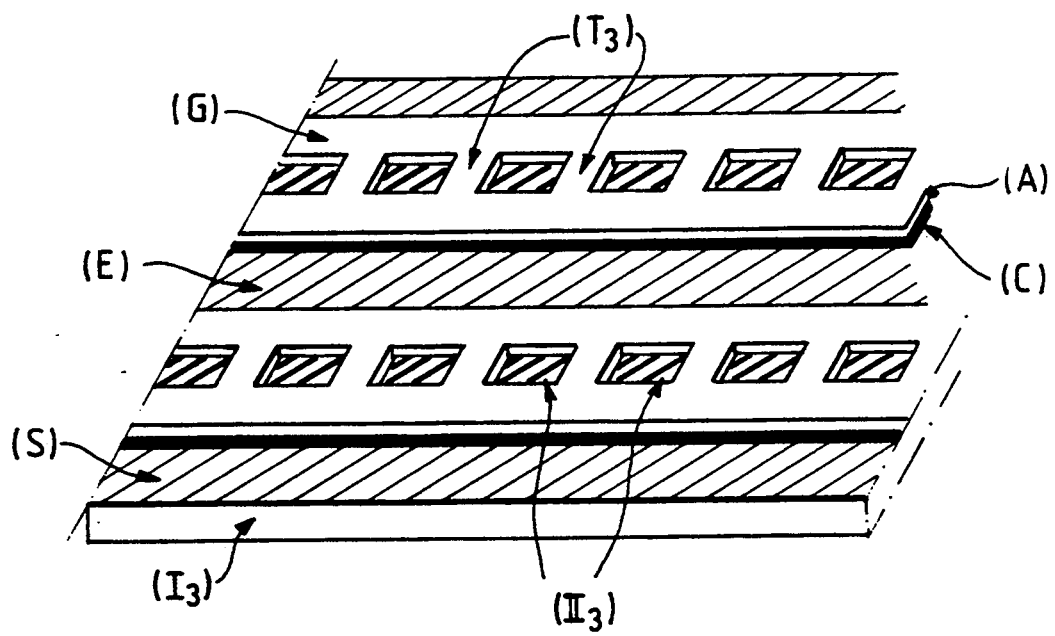
FIG. 3 shows the substrate ($I_3$) as well as these semiconductor electrodes associated with transistors in an alternative embodiment of a display device according to the invention.

In a display device according to the invention, the electro-optical unit is inserted between a substrate ($I_2$) comprising the columns of electrodes ($II_2$) (FIG. 2) and a substrate ($I_3$) comprising the semiconductor electrodes ($II_3$) and the control transistors ($T_3$). These transistors may have a direct multistage structure, the gate being deposited on the semiconductor, or a reverse multistage structure, the gate being buried beneath the semiconductor. FIG. 3 illustrates an exemplary embodiment of a substrate ($I_3$) with its electrodes ($II_3$) used in a display device according to the invention. On this substrate, the gate is represented by a metal ladder, the internal spaces defined by the uprights and the rungs forming the electrodes ($II_3$). In this exemplary embodiment, the transistors have a direct multistage structure.

Figure 4:
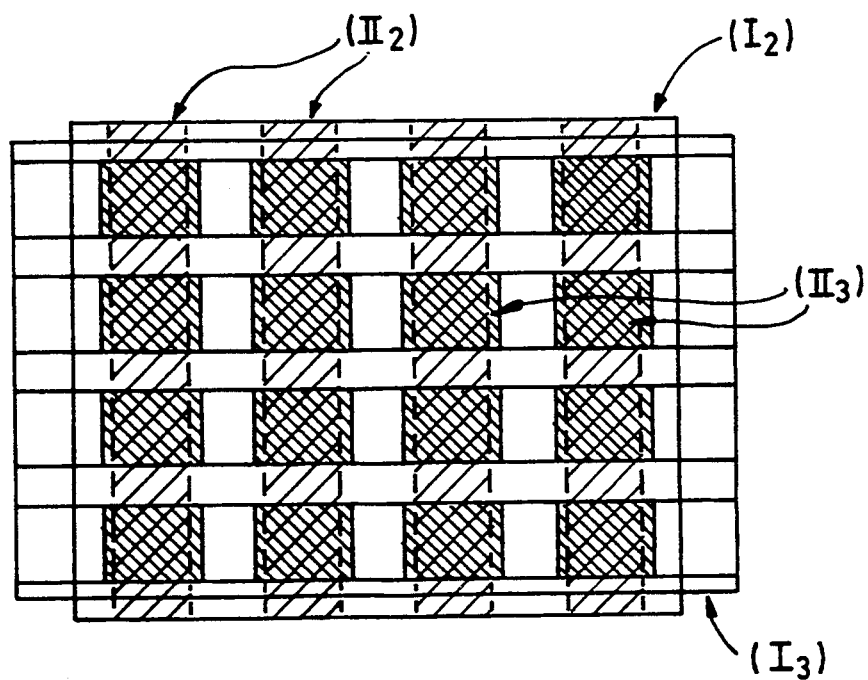
FIG. 4 exemplifies a display device according to the invention, wherein the substrate ($I_3$) and its substrate are those shown in FIG. 3.

The metal gate (G) is deposited on a gate insulating ladder (A), itself deposited on a semiconductor material (S) deposited beforehand on the substrate ($I_3$). The electrodes ($II_3$) defined by the interior of the ladder rungs have a conductivity s greater than the conductivity $s_o$ of the semiconductor zones (C) facing the insulating ladder (A). Since the space (E) between ladders also has a conductivity s, it is possible to carry the layer of semiconductor material to a determined potential V. When the gate (G) is energized, the transistors are on and the electrodes ($II_3$) are thus carried to the potential V. The information elements transmitted by the columns of electrodes are then displayed on the pixels of the addressed line. The display device thus made with an electro-optical material inserted between the substrates ($I_2$) and ($I_3$) is shown in FIG. 4.

It is also possible to consider the case of operation where the potentials of the different columns are alternated; the charges are then shifted essentially horizontally, between neighboring pixels. The role of the zones (E) is to bring the entire unit to the potential V in the event of drift.

It is also possible to replace the transparent column electrodes by reflecting electrodes in order to use the screen in this mode.

This type of display unit preferably uses a liquid crystal material that may be a twisted nematic liquid crystal. The semiconductor used may be of a variety of natures but should, nevertheless, meet the following criteria:
it should have high transparency to light.
it should have a conductivity s at least equal to 1 microsiemens and have a canal leakage lower than some femtoamperes per micron to enable the storage of the information elements when a line ceases to be addressed.

An object of the invention is also the method for making this display device. This method uses the gates (G) of the transistors as a mask to define the semiconductor electrodes ($II_3$) enabling a self-alignment of the source and of the drain of a transistor.

More precisely, the control gates are used as a mask to dope the semiconductor layer parts that are not facing the gates. The nature and the making of the doping are adapted to the direct or reverse structure of the transistors as well as to the nature of the semiconductor used.

In the case of amorphous or polycrystalline silicon, for a direct structure of transistors, the standard techniques of phosphorus implantation can be used to dope the regions adjacent to the gate in order to obtain n+doped regions which form the pixel electrodes and the space between two adjacent lines.

In the method according to the invention, a semiconductor layer, for example polycrystalline silicon with little doping, is deposited on a glass plate, the doping being chosen as a function of the conductivity beneath the channel.

An insulating thin layer, for example silicon oxide (A), is formed, this layer acting as an insulator for the transistor gate.

A metal layer is then deposited by photolithography, in order to define the ladders constituting the gates of the transistors as well as the gate insulator ladders.

The doping may then be done by standard implantation of phosphorus if the semiconductor material is silicon, enabling the doping of the regions constituting the pixel electrodes and the space between two adjacent lines. The metal gate is used as a mask during the doping operation. As a consequence, the semiconductor zones facing the uprights and the rungs of the ladder remain little doped.

The array of pixel electrodes ($II_3$) thus defined on the substrate ($I_3$) is superimposed on the array of column electrodes ($II_2$) made on the substrate ($I_2$). The electro-optical material is inserted between these two substrates and the unit forms a matrix display device using electro-optical material.

In the case of a reverse multistage structure, a layer of phosphorus may be deposited beforehand on a silicon layer, the gate being deposited on the substrate ($I_3$) and buried beneath the semiconductor layer. The diffusion of phosphorus in the semiconductor may be done through the substrate ($I_3$) by the laser beam which prompts a heating capable of generating the doping, this laser beam being, on the other hand, reflected by the metal gate. It is also possible, after the deposition and etching of the metal and insulator layers, to carry out the selective etching of phosphorus on the substrate and not on the insulator. The procedure is followed by the deposition of silicon and by the thermal diffusion of phosphorus. The method of self-alignment of the source and of the drain, or again of two line pixel electrodes, may thus be obtained whether the transistors have a direct or reverse structure.

What is claimed is:

1. A matrix device using electro-optical material, said matrix display device comprising a matrix array of elementary picture zones and, in each elementary zone, an electro-optical material placed between two electrodes, the picture display in each of said zones being a function of an electrical field applied between the two electrodes located in said zone, means for the addressing the electrodes being designed for the selective application, in each of said zones, of a desired electrical field, with a first one of the two electrodes being constituted by a transparent doped semiconductor zone completely surrounded by a substantially undoped semiconductor zone, said substantially undoped semiconductor zone constituting a channel of a control transistor with said first electrode forming a source or a drain of said transistor.

2. A display device according to claim 1, wherein the electro-optical material for each said elementary zone is inserted between a first substrate on which columns of second ones of said two electrodes are defined and a second substrate on which each of said first one of said two electrodes are defined by said transistor, with said transistor having a gate aligned with said substantially undoped zones.

3. A display device according to claim 2, wherein the set of gates of a line is defined by a ladder structure, the rungs of which separate two line electrodes, the uprights defining an addressing line.

4. A display device according to any of the claims 1 to 3, wherein the electro-optical material is a liquid crystal.

5. A display device according to claim 4, wherein the liquid crystal is a twisted nematic liquid crystal.

6. A display device according to any of the claims 1 to 3, wherein the semiconductor is amorphous or polycrystalline silicon.

7. A display device according to any of the claims 1 to 3, wherein the transistors have a direct multistage structure, the gate being deposited on a gate insulator itself deposited on the zones with little or no doping.

8. A display device according to any of the claims 1 to 3, wherein the transistors have a reverse multistage structure, the gate being deposited on the substrate and buried beneath the gate insulator and the semiconductor.

9. A display device according to claim 8, wherein the semiconductor is silicon doped with phosphorus under the action of a laser working through the substrate.

10. A display device according to claim 8, wherein the selective deposition of phosphorus on the substrate is done after the deposition and the etching of the metal and insulator layers, the silicon being then deposited on the entire unit and locally doped by thermal diffusion of the phosphorus.

* * * * *